United States Patent
Oki et al.

(10) Patent No.: US 6,664,344 B1
(45) Date of Patent: Dec. 16, 2003

(54) COMPOSITION OF POLYEPOXIDE, PHENOLIC CO-CONDENSATE AND PHOSPHONIUM-POLYPHENOLIC MOLECULAR ASSOCIATION PRODUCT

(75) Inventors: Hiromi Oki, Tokyo (JP); Yoshiyuki Go, Tokyo (JP); Sumiya Miyake, Tokyo (JP); Yoshihito Akiyama, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/762,950

(22) PCT Filed: Mar. 10, 2000

(86) PCT No.: PCT/JP00/01448

§ 371 (c)(1),
(2), (4) Date: Feb. 15, 2001

(87) PCT Pub. No.: WO01/07501

PCT Pub. Date: Feb. 1, 2001

(30) Foreign Application Priority Data

Jul. 22, 1999 (JP) .......................................... 11-207498

(51) Int. Cl.$^7$ .......................... C08L 63/00; C08L 63/04
(52) U.S. Cl. ..................................... 525/481; 525/485
(58) Field of Search .................................. 525/481, 485

(56) References Cited

U.S. PATENT DOCUMENTS 4,340,761 A * 7/1982 Doorakian et al. ............ 568/11
5,188,767 A   2/1993 Yamazaki et al. .......... 252/512

FOREIGN PATENT DOCUMENTS

| EP | 686621 | | 12/1995 |
|---|---|---|---|
| JP | 54-58795 A | * | 5/1979 |
| JP | 54-113256 A | * | 9/1979 |
| JP | 58-119654 A | | 7/1983 |
| JP | 60-054458 A | | 3/1985 |
| JP | 63-248823 A | | 10/1988 |
| JP | 2-240132 A | | 9/1990 |
| JP | 2-240133 A | | 9/1990 |
| JP | 3-296526 A | | 12/1991 |
| JP | 7-173253 A | * | 7/1995 |
| JP | 7-173253 | | 7/1995 |
| JP | 7-228670 | | 8/1995 |
| JP | 7-330787 | | 12/1995 |
| JP | 8-41290 | | 2/1996 |
| JP | 8-041290 A | | 2/1996 |
| JP | 8-196911 | | 8/1996 |
| JP | 9-124772 | | 5/1997 |
| JP | 9-124772 A | | 5/1997 |
| JP | 9-157497 | | 6/1997 |
| JP | 9-328535 | | 12/1997 |
| JP | 9-328535 A | * | 12/1997 |
| JP | 10-245432 A | | 9/1998 |
| JP | 10-245432 A | * | 9/1998 |
| JP | 10-279670 A | | 10/1998 |
| JP | 11-21431 A | * | 1/1999 |
| JP | 11-21431 | | 1/1999 |

* cited by examiner

Primary Examiner—Robert E. Sellers, II
(74) Attorney, Agent, or Firm—Smith, Gambrell & Russell, LLP

(57) ABSTRACT

The present invention provides an epoxy resin composition that has both a rapidly-curability and an excellent storage stability and is useful in the field of electronic and electric materials. That is, the present invention is an epoxy resin composition comprising a compound (A) having two or more epoxy groups in the molecule, a co-condensation product (B) having two or more phenolic hydroxyl groups in the molecule, and a molecular association product (C) of a tetra-substituted phosphonium (X), a compound (Y) having two or more phenolic hydroxyl groups in the molecule, and a conjugate base of the compound (Y) having two or more phenolic hydroxyl groups in the molecule, said conjugate base being a phenoxide type compound obtained by removing a hydrogen atom from the aforesaid compound (Y) having two or more phenolic hydroxyl groups in the molecule.

28 Claims, 2 Drawing Sheets

COMPOSITION OF POLYEPOXIDE, PHENOLIC CO-CONDENSATE AND PHOSPHONIUM-POLYPHENOLIC MOLECULAR ASSOCIATION PRODUCT

TECHNICAL FIELD

This invention relates to an epoxy resin composition that is good in curability and shelf life and is useful in the field of electronic and electric materials, and to a semiconductor device obtained by using said composition.

BACKGROUND ART

Electronic and electric materials, in particular, IC encapsulating materials, have recently been required to have not only a rapid-curability for improvement in production efficiency but also an improved shelf life for improvement in handleability at the time of transportation and storage. In epoxy resin compositions for use in the electronic and electric field, various compounds, for example, phosphines, amines, nitrogen-containing heterocyclic compounds such as imidazole type compounds and diazabicycloundecene, quaternary ammonium, phosphonium and arsonium compounds have been used as curing accelerators.

These conventional curing accelerators often have curing-accelerating effect also at a relatively low temperature such as ordinary temperature. This property deteriorates the quality of a product, for example, it causes viscosity increase, fluidity decrease, nonuniformity in curability, etc. during the production of an epoxy resin composition and the storage of the resulting epoxy resin composition. In order to solve this problem, the so-called latent curing accelerators capable of suppressing viscosity and fluidity changes with time at low temperatures and causing curing reaction only on heating at the time of shaping or molding have been vigorously investigated in recent years. As a means for solving the problem, the impartment of the latency by protecting the active site of a curing accelerator with an ion pair is investigated. JP-A-8-41290 discloses latent curing accelerators having a salt structure formed by each of various organic acids and a phosphonium ion. This phosphonium salt, however, does not have a specific high-order molecular structure, so that the ion pair is relatively easily affected by the external environment. Therefore, recent semiconductor-encapsulating materials obtained by the use of low-molecular weight epoxy resins or phenol-aralkyl resins are disadvantageous in that they have a deteriorated shelf life.

DISCLOSURE OF THE INVENTION

The present invention is intended to provide an epoxy resin composition that has both a rapid-curability and an excellent storage stability and is useful in the field of electronic and electric materials, and a semiconductor device obtained by using said composition.

That is, the present invention provides an epoxy resin composition comprising a compound (A) having two or more epoxy groups in the molecule, a co-condensation product (B) having two or more phenolic hydroxyl groups in the molecule, and a molecular association product (C) of a tetra-substituted phosphonium (X), a compound (Y) having two or more phenolic hydroxyl groups in the molecule, and a conjugate base of the compound (Y) having two or more phenolic hydroxyl groups in the molecule, said conjugate base being a phenoxide type compound obtained by removing a hydrogen atom from the aforesaid compound (Y) having two or more phenolic hydroxyl groups in the molecule; and a semiconductor device characterized by being obtained by encapsulating a semiconductor element with said composition. The present inventors found that an epoxy resin composition having very excellent curability and storage stability can be obtained by utilizing a salt structure having a protected reactive site, as a curing accelerator, whereby the present invention has been accomplished.

DETAILED DESCRIPTION OF THE INVENTION

Figure 1:
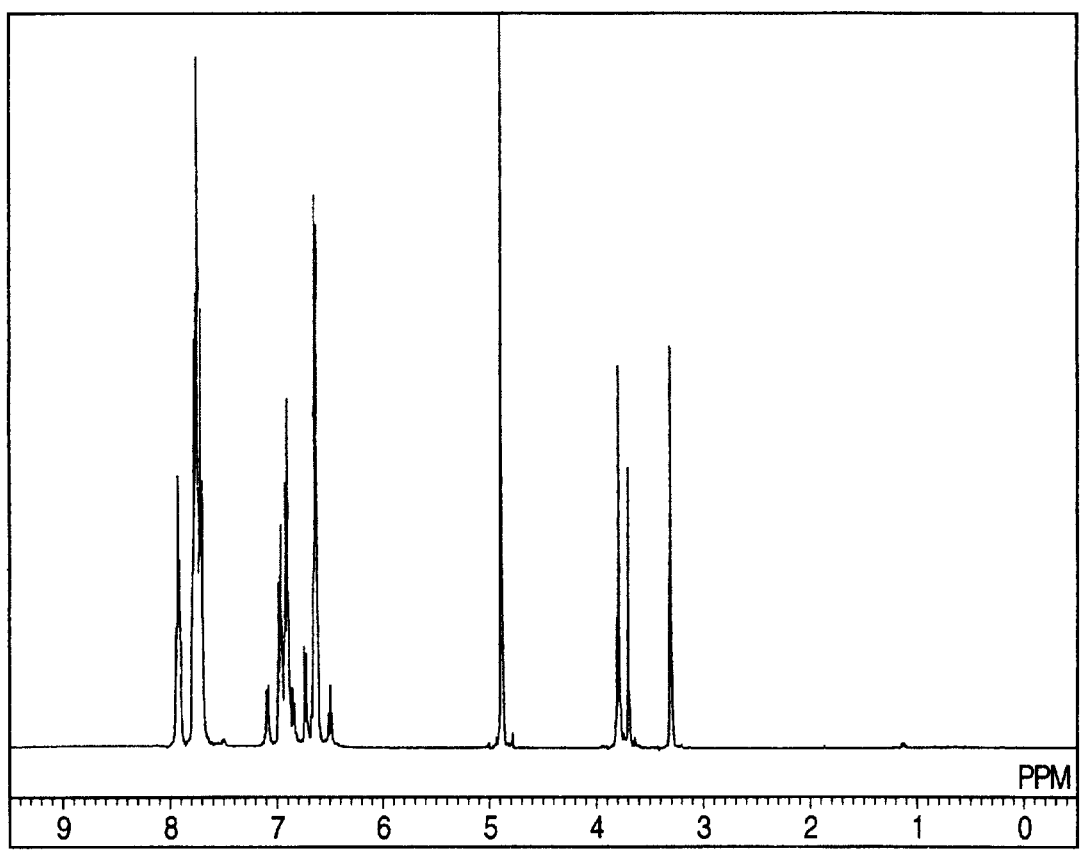
FIG. 1 is a $^1$H-NMR chart of compound C1 obtained in Synthesis Example 1.

As the compound (A) having two or more epoxy groups in the molecule used in the present invention, any compound may be used without any limitation so long as it has two epoxy groups in the molecule. The compound (A) includes, for example, bisphenol A type epoxy resins, bisphenol F type epoxy resins, brominated bisphenol type epoxy resins, biphenyl type epoxy resins, stilbene type epoxy resins, phenolic novolak type epoxy resins, cresol novolak type epoxy resins, alicyclic epoxy resins, glycidyl ester type epoxy resins, glycidyl amine type epoxy resins, naphthalene type epoxy resins, glycidyl ether compounds of resins synthesized by condensation of naphthol or the like with a carbonyl compound, 4,4'-bis(1,2-epoxyethyl)diphenyl ether, 4,4'-bis(1,2- epoxyethyl)biphenyl, glycidyl ether compounds of phenolic resins obtained by reacting dicyclopentadiene with a phenol, and glycidyl ether compounds of mononuclear compounds such as resorcin, catechol, etc. These may be used singly or as a mixture thereof.

Of these epoxy resins, crystalline epoxy resins having a melting point of 50–150° C. are preferable. Such crystalline epoxy resins have a high crystallinity because they have a rigid and straight structure such as biphenyl skeleton, bisphenol skeleton, stilbene skeleton or the like in the main chain and have a relatively low molecular weight. The crystalline epoxy resin is a crystalline solid at ordinary temperature but is rapidly melted into a liquid with a low viscosity at a temperature higher than its melting point. The melting point of the crystalline epoxy resin refers to a temperature at the top of a heat absorption peak in the case of crystal melting caused by heating from ordinary temperature at a heating rate of 5° C./min by the use of a differential scanning calorimeter.

As crystalline epoxy resins satisfying these conditions, it is especially preferable to use one or more epoxy resins selected from epoxy resins represented by the general formulas (1) and (2), or a mixture of a stilbene type epoxy resin represented by the general formula (3) and a stilbene type epoxy resin represented by the general formula (4).

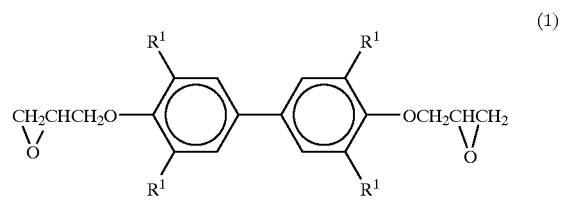

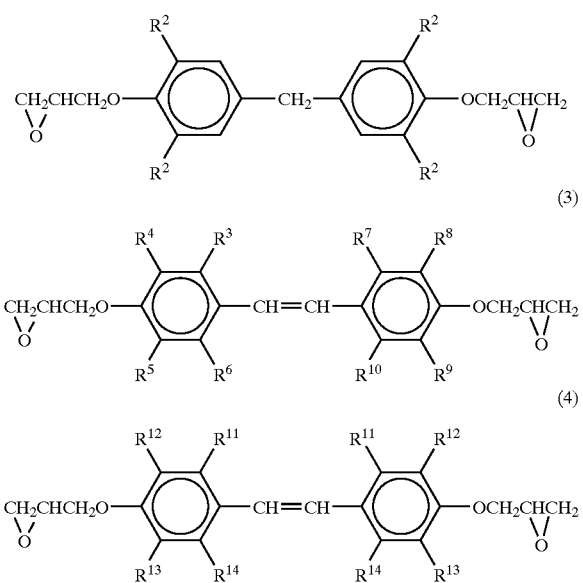

The substituents R¹'s, which may be the same or different, of the biphenyl type epoxy resin of the general formula (1) and the substituents R²'s, which may be the same or different, of the bisphenol type epoxy resin of the general formula (2), are groups or atoms selected from the group consisting of hydrogen atom, chain or cyclic alkyl groups of at most 6 carbon atoms, phenyl group and halogen atoms. They include, for example, methyl group, ethyl group, propyl group, butyl group, cyclohexyl group, phenyl group, chlorine atom and bromine atom. Methyl group is especially preferable. The substituents $R^3$ through $R^{14}$, which may be the same or different, of the stilbene type epoxy resins of the general formulas (3) and (4), are groups or atoms selected from the group consisting of hydrogen atom, chain or cyclic alkyl groups of at most 6 carbon atoms, and halogen atoms. They include, for example, hydrogen atom, methyl group, ethyl group, propyl group, butyl group, amyl group, hexyl group (including its isomers), cyclohexyl group, chlorine atom and bromine atom. Methyl group, ethyl group, propyl group or butyl group is especially preferable because of reducing the melt viscosity of the epoxy resin.

The stilbene type epoxy resins are in the form of a mixture of a stilbene type epoxy resin of the general formula (3) and a stilbene type epoxy resin of the general formula (4). Each of the stilbene type epoxy resin of the general formula (3) and the stilbene type epoxy resin of the general formula (4) includes those having various structures, depending on the kinds of the substituents. As each of the stilbene type epoxy resin of the general formula (3) and the stilbene type epoxy resin of the general formula (4), either a stilbene type epoxy resin having a single structure or a mixture of stilbene type epoxy resins having two or more structures, respectively, may be used.

A method for mixing the stilbene type epoxy resin of the general formula (3) and the stilbene type epoxy resin of the general formula (4) is not particularly limited so long as the mixing of the compounds of the general formulas (3) and (4) lowers the melting point. The mixing method includes, for example, a method of mixing stilbene type phenols as starting materials for the stilbene type epoxy resins before conversion to a glycidyl ether, and a method of melt-mixing the stilbene type epoxy resins of the general formulas (3) and (4). When any of such methods is adopted, the melting point is adjusted to 50–150° C.

As the stilbene type epoxy resin of the general formula (3), compounds obtained by converting 5-tert-butyl-4,4'-dihydroxy-2,3', 5'-trimethylstilbene and 3-tert-butyl-4,4'-dihydroxy-3', 5,5'-trimethylstilbene to a glycidyl ether are especially preferable from the viewpoint of availability, performance characteristics and raw material cost.

As the stilbene type epoxy resin of the general formula (4), compounds obtained by converting 4,4'-dihydroxy-3,3', 5,5'-tetramethylstilbene, 4,4'-dihydroxy-3,3'-di-tert-butyl-6, 6'-dimethylstilbene and 4,4'-dihydroxy-3,3'-di-tert-butyl-5, 5'-dimethylstilbene to a glycidyl ether are especially preferable from the viewpoint of performance characteristics and raw material cost.

The co-condensation product (B) having two or more phenolic hydroxyl groups in the molecule which is used in the present invention acts as a curing agent for the compound (A) having two or more epoxy groups in the molecule. Specifically, the co-condensation product (B) includes phenolic resins that are co-condensation products of a phenol and an aldehyde or a ketone, and phenol-aralkyl resins having a phenylene or diphenylene skeleton which are co-condensation products of a bisphenol or a phenol and dimethoxy-p-xylene or the like. Mononuclear compounds such as resorcin and catechol may also be used so long as they cause curing reaction. Since "phenol" is generally defined as a compound obtained by replacing one or more hydrogen atoms bonded to an aromatic ring with hydroxyl groups, respectively, the co-condensation product (B) also includes, for example, co-condensation products of a hydroxyl-containing compound derived from a fused-polycyclic aromatic compound such as naphthol, and a carbonyl compound. Of the phenolic resins exemplified above, the phenol-aralkyl resins are especially preferable for the following reasons: the percentage of water absorption of the cured product is low because the phenol-aralkyl resin has only a small number of hydroxyl groups in the molecule; the reactivity of the phenol-aralkyl resin in curing reaction is high because its molecule has a suitable flexibility; and the viscosity can be reduced.

As to the ratio between the compound (A) having two or more epoxy groups in the molecule and the co-condensation product (B) having two or more phenolic hydroxyl groups in the molecule as a curing agent, which are used in the present invention, the curability and the heat resistance, electric characteristics and the like of the cured product can be further improved by adjusting the ratio so that the equivalent ratio of the co-condensation product (B) to the compound (A) may be 0.5–2, preferably approximately 0.8–1.2.

The molecular association product (C) used in the present invention is a molecular association product of a tetra-substituted phosphonium (X), a compound (Y) having two or more phenolic hydroxyl groups in the molecule and a conjugate base of the compound (Y) having two or more phenolic hydroxyl groups in the molecule, said conjugate base being a phenoxide type compound obtained by removing a hydrogen atom from the aforesaid compound (Y) having two or more phenolic hydroxyl groups in the molecule.

The substituents of the tetra-substituted phosphonium (X) as a constituent of the molecular association product (C) are not limited at all and may be the same or different. For example, tetra-substituted phosphonium ions having substituted or unsubstituted aryl or alkyl groups as the substituents are preferable because they are stable to heat and hydrolysis. Specific examples thereof are tetraphenyl- phosphonium, tetratolylphosphonium, tetraethylphenyl- phosphonium, tetramethoxyphenylphosphonium, tetranaphthylphosphonium, tetrabenzylphosphonium, ethyltriphenylphosphonium, n-butyltriphenylphosphonium, 2-hydroxyethyltriphenyl-phosphonium, trimethylphenyl-phosphonium, methyldiethylphenylphosphonium, methyldiallylphenyl-phosphonium, tetra-n-butylphosphonium, etc.

The compound (Y) having two or more phenolic hydroxyl groups in the molecule, a constituent of the molecular association product (C) used in the present invention, includes for example, bisphenols such as a compound rerpresented by the formula (5), bis(4-hydroxy-3,5-dimethyphenyl)methane (common name: tetramethyl-bisphenol F), 4,4'-sulfonyldiphenol, compounds represented by the general formula (6) [e.g. 4,4'-isopropylidenediphenol (common name: bisphenol A), bis(4-hydroxyphenyl)methane, bis(2-hydroxyphenyl)methane, and (2-hydroxyphenyl) (4-hydroxyphenyl)methane], and mixtures of three of these compounds represented by the formula (6), i.e., bis(4-hydroxyphenyl)methane, bis(2-hydroxyphenyl)methane, and (2-hydroxyphenyl)(4-hydroxyphenyl)methane (e.g., Bisphenol F-D, mfd. by HONSHU Chemical Industry Co., Ltd.); dihydroxybenzenes such as 1,2-benzenediol, 1,3-benzenediol and 1,4-benzenediol; trihydroxybenzenes such as 1,2,4-benzenetriol; various isomers of dihydroxynaphthalenes such as 1,6-dihydroxynaphthalene; and various isomers of biphenols such as 2,2'-biphenol and 4,4'-biphenol.

In addition, the conjugate base as another constituent is a phenoxide type compound obtained by removing a hydrogen atom from the above-mentioned compound (Y).

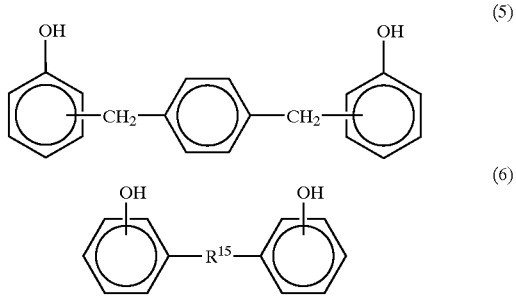

(5)

(6)

The molecular association product (C) used in the present invention has a salt of phosphonium-phenoxide type in its structure as described above, but it is different from compounds of phosphonium-organic acid anion salt type used in the prior art, in that a high-order structure formed by hydrogen bonds surrounds an ionic bond in the molecular association product (C) used in the present invention. The reactivity of the salts used in the prior art is controlled only by the strength of an ionic bond. On the other hand, the molecular association product (C) used in the present invention has the so-called latent reactivity as follows: the high-order structure of anions protects the active site by surrounding at ordinary temperature, but it is destroyed in a molding step to expose the active site, so that the reactivity is exhibited.

The amount of the molecular association product (C) capable of acting as a curing accelerator is suitably approximately 0.5–20 parts by weight per 100 parts by weight of the sum of the above-mentioned compound (A) and co-condensation product (B), because a good balance can be attained among curability, shelf life and other characteristics.

Inorganic fillers such as silica powder, mold release agents such as carnauba wax, silane-type coupling agents, stress-reducing agents such as silicone oil, coloring agents such as carbon black, etc. may be properly added to the epoxy resin composition comprising the components (A), (B) and (C) of the present invention. This addition causes no trouble at all so long as it is made most suitable depending on purpose of use. When the epoxy resin composition of the present invention is used as an encapsulating material, the amount of the inorganic fillers and the amount of the mold release agents or the coupling agents are suitably approximately 100–2400 parts by weight and approximately 0.1–20 parts by weight, respectively, per 100 parts by weight of the sum of the compound (A) and the co-condensation product (B).

The epoxy resin composition of the present invention is obtained by mixing the above-mentioned components and kneading the resulting mixture with heating by the use of a heating kneader, an extruder, a heated roll or the like.

Although a process for producing the molecular association product (C) used in the present invention is not limited at all, the following two typical processes can be exemplified. The first process comprises reacting a tetra-substituted phosphonium.tetra-substituted borate (Z) with a compound (Y) having two or more phenolic hydroxyl groups in the molecule, at a high temperature, and then subjecting the reaction product to thermal reaction in a solvent having a boiling point of 60° C. or higher. The second process comprises reacting a compound (Y) having two or more phenolic hydroxyl groups in the molecule, with an inorganic or organic base and a tetra-substituted phosphonium halide.

These two processes are described below in detail.

In the first process comprising reacting a tetra-substituted phosphonium.tetra-substituted borate (Z) with a compound (Y) having two or more phenolic hydroxyl groups in the molecule, at a high temperature, and then subjecting the reaction product to thermal reaction in a solvent having a boiling point of 60° C. or higher, the preceding reaction step is a reaction involving substitution on boron. The phenolic hydroxyl groups of the compound (Y) participate deeply in the substitution, and the optimum value of the molar ratio of the borate (Z) having four substituents on boron to the compound (Y) having two or more phenolic hydroxyl groups in the molecule is unequivocally determined.

In effect, when the number of the phenolic hydroxyl groups present in the compound (Y) is taken as n (n is an integer of 2 or more) and the number of moles of the compound (Y) is less than 1/n per mole of the borate (Z), the amount of the phenolic hydroxyl groups necessary for the reaction is not sufficient, so that the substitution on boron is not sufficiently carried out. Therefore, the thermal reaction in a solvent in the subsequent step is not sufficiently carried out in some cases. It is conjectured that when the number of moles of the compound (Y) is more than 4 per mole of the borate (Z), the excess compound (Y) cannot be completely removed and deteriorates characteristics of the molecular association product (C). The present inventors have confirmed that the reaction can be most suitably carried out by adjusting the molar ratio of the compound (Y) to the borate (Z) to not more than 4 and not less than 1/n. The reaction can be monitored by measuring the release rate of the phenyl substituents on boron. For example, when tetraphenylphosphonium tetraphenyl borate is used, the reaction can be monitored by measuring the amount of benzene produced by the substitution of the phenyl groups on boron by the phenolic hydroxyl groups. Usually, the reaction proceeds sufficiently when benzene is produced in an amount of 80 wt % or more of the theoretical amount of benzene produced.

The kind of the solvent used for carrying out the subsequent thermal reaction in the solvent in the synthesis of the molecular association product (C) is not particularly limited so long as the solvent has a boiling point of 60° C. or higher. Solvents having at least one hydroxyl group in the molecule and having a boiling point of 60° C. or higher are preferable. Conventional alcohol solvents such as methanol, ethanol, propanol, butanol, etc. are especially suitable.

The period of time for the thermal reaction in the solvent is preferably 1 hour or more. The thermal reaction need not always be a reaction with refluxing, that is, refluxing is not necessary so long as the thermal reaction is carried out under conditions wherein heating at 60° C. or higher is substantially possible. When the conditions described above are employed, the product synthesized by the reaction in the preceding step is sufficiently diffused into the solvent in the subsequent step, and components derived from boron and the excess component (Y) are removed, whereby the molecular association product (C) is formed. The first production process is advantageous also in that after dissolving the insoluble materials by temporarily increasing the solubility by heating the alcohol solvent, the desired molecular association product (C) can be re-precipitated by re-cooling.

The second process comprising reacting a compound (Y) having two or more phenolic hydroxyl groups in the molecule, with an inorganic or organic base and a tetra-substituted phosphonium halide is described below in detail. The compound (Y) and the inorganic or organic base are dissolved in a solvent such as an alcohol, followed by adding thereto a solution of the tetra-substituted phosphonium halide in a suitable solvent, and the reaction is carried out. Finally, the solid reaction product is isolated by an operation such as recrystallization or reprecipitation.

The inorganic base includes, for example, sodium hydroxide and potassium hydroxide. The organic base includes, for example, pyridine and triethylamine.

The substituents of the tetra-substituted phosphonium halide used are not limited at all and may be the same or different. For example, tetra-substituted phosphonium ions having substituted or unsubstituted aryl or alkyl groups as the substituents are preferable because they are stable to heat and hydrolysis. Specific examples thereof are tetraphenylphosphonium, tetratolylphosphonium, tetraethylphenylphosphonium, tetramethoxyphenylphosphonium, tetranaphthylphosphonium, tetrabenzylphosphonium, ethyltriphenylphosphonium, n-butyltriphenylphosphonium, 2-hydroxyethyltriphenylphosphonium, trimethylphenylphosphonium, methyldiethylphenylphosphonium, methyldiallylphenylphosphonium, tetra-n-butylphosphonium, etc. The halide includes chloride and bromide. The tetra-substituted phosphonium halide may be selected depending on its price, characteristics (e.g. hygroscopicity) and availability, and either tetra-substituted phosphonium chlorides or tetra-substituted phosphonium bromides may be used.

BEST MODE FOR CARRYING OUT THE INVENTION

Examples of the present invention are described below but they are not intended in any way to limit the scope of the invention.

First, examples of synthesis of molecular association products (C) by two processes are described below. For analyzing the structure of each of the molecular association products (C) synthesized, the equivalent weight of the active group of this curing accelerator was estimated by neutralization titration. In addition, $^1$H-NMR measurement was carried out for determining the compositional ratio of each molecular association product (C).

Then, each molecular association product (C) obtained was added to a mixture of a compound (A) having two or more epoxy groups in the molecule and a co-condensation product (B) having two or more phenolic hydroxyl groups in the molecule, and they were ground and mixed. The resulting mixture was melt-kneaded on an iron plate at 100° C. for 5 minutes, cooled, and then ground to prepare a composition sample, characteristics of which were evaluated. For evaluating the characteristics, the torque at curing was measured with a curastometer, and the residual rate of heat generated by curing was measured with a differential scanning calorimeter (DSC) (Examples 1 to 6 and Comparative Examples 1 and 2).

In addition, other epoxy resin compositions were prepared and their characteristics were evaluated with respect to the epoxy resin compositions themselves and semiconductor devices obtained by using the compositions (Examples 7 to 14 and Comparative Examples 3 and 4).

Evaluation methods are as follows.

1. Neutralization Titration:

For estimating the equivalent weight of the active group of each curing accelerator, the alkali equivalent weight of the synthesized molecular association product (C) was measured in a methanol/water solvent by using oxalic acid and sodium hydroxide. Specifically, the molecular association product (C) was reacted with a known weight of excess oxalic acid, and the weight of the residual oxalic acid was determined with an aqueous sodium hydroxide solution having a known normality. Then, the normality per unit weight (N/g) of the molecular association product (C) was calculated. The reciprocal of the calculated value is the equivalent weight of the phosphonium phenoxide.

2. Determination of Compositional Ratio:

For determining the compositional ratio among a tetra-substituted phosphonium (X), a compound (Y) having two or more phenolic hydroxyl groups in the molecule [number of moles per mole of (X): (a)] and a phenoxide type conjugate base [number of moles per mole of (X): (b)] obtained by removing a hydrogen atom from the aforesaid compound (Y), in each synthesized molecular association product (C), $^1$H-NMR measurement was carried out in deuterated methanol. Then, the peak area value of protons of the substituents of the tetra-substituted phosphonium and the peak area value of phenyl protons of the compound (Y) having two or more phenolic hydroxyl groups in the molecule [number of moles per mole of (X): (a)] and the phenoxide type conjugate base [number of moles per mole of (X): (b)] obtained by removing a hydrogen atom from the aforesaid compound (Y) were calculated. Using the calculated values, the compositional ratio among the components [molar ratio (a+b)/(X)] was calculated.

3. Torque at Curing:

Using each composition sample prepared by the above-mentioned preparation process, the torque at 175° C. after 45 seconds was measured with a curastometer (JSR curastometer Model PS, mfd. by Orientic Co.). The torque measured with the curastometer is an indication of the curability: the higher the torque value, the higher the curability.

4. Residual Rate of Heat Generated by Curing (Evaluation of Shelf Life):

Using each composition sample prepared by the above-mentioned preparation process, the initial amount of heat generated by curing immediately after the preparation and the amount of heat generated by curing after storage at 40° C. for 3 days were measured. The percentage of the amount of heat generated by curing after the storage (mJ/mg) based on the initial amount of heat generated by curing (mJ/mg) was calculated. The amount of heat generated by curing was measured at a heating rate of 10° C./min with a differential scanning calorimeter (DSC). The higher calculated value means the better shelf life.

5. Spiral Flow (Fluidity Evaluation):

The spiral flow of a material produced by preparing each epoxy resin composition was measured by the use of a mold for spiral flow measurement according to EMMI-1-66 under the following conditions: mold temperature 175° C., injection pressure 70 kg/cm$^2$, and curing time 2 minutes. The spiral flow is an indication of the fluidity: the higher the spiral flow value, the better the fluidity. The spiral flow is expressed in cm.

6. Shore D Hardness:

A material produced by preparing each epoxy resin composition was molded under the following conditions: mold temperature 175° C., injection pressure 70 kg/cm$^2$, and curing time 2 minutes. A Shore D hardness value measured 10 seconds after mold opening was taken as curability. The Shore D hardness is an indication of the curability: the higher the Shore D hardness value, the better the curability.

7. 30° C. Shelf Life:

A material produced by preparing each epoxy resin composition was stored at 30° C. for 1 week, and then its spiral flow was measured. The 30° C. shelf life is shown as a percentage of said spiral flow based on a spiral flow value measured immediately after the preparation.

SYNTHESIS OF MOLECULAR ASSOCIATION PRODUCTS (C)

SYNTHESIS EXAMPLE 1

Into a 3-liter separable flask were charged 300 g (1.5 moles) of Bisphenol F-D (corresponding to the compound (Y)) manufactured by HONSHU Chemical Industry Co., Ltd. and 329 g (0.5 mole) of tetraphenylphosphonium.tetraphenyl borate (Z), and they were reacted at 200° C. for 3 hours. The amount of benzene distilled out in the reaction was 97 wt % of the theoretical amount of benzene produced, that is, the distilling-out ratio of benzene was 97%. The crude product obtained by the reaction was finely ground and then charged into the separable flask, followed by adding thereto 2-propanol 3 times weight as much as the crude product charged. The resulting mixture was stirred at an internal temperature of 82.4° C. (the boiling temperature of 2-propanol) for 1.5 hours. Then, a large portion of the 2-propanol was removed and furthermore, the low-boiling materials are removed with heating under reduced pressure. The product thus obtained was named compound C1. C1 was subjected to neutralization titration to determine its alkali equivalent weight. FIG. 1 shows $^1$H-NMR data of C1. Deuterated methanol was used as a solvent for the $^1$H-NMR measurement. The peaks near 4.8 ppm and 3.3 ppm are due to the solvent. A group of peaks near 6.4–7.1 ppm are due to phenyl protons of the starting bisphenol F [number of moles per mole of (X): (a)] and a phenoxide type conjugate base [number of moles per mole of (X): (b)] obtained by removing a hydrogen atom from the bisphenol F, and a group of peaks near 7.6–8.0 ppm are due to phenyl protons of a tetraphenylphosphonium group. From the ratio between the total peak area values obtained for the two groups of peaks, the molar ratio (a+b)/(X) was calculated to be 2.2/1.

SYNTHESIS EXAMPLE 2

Figure 2:
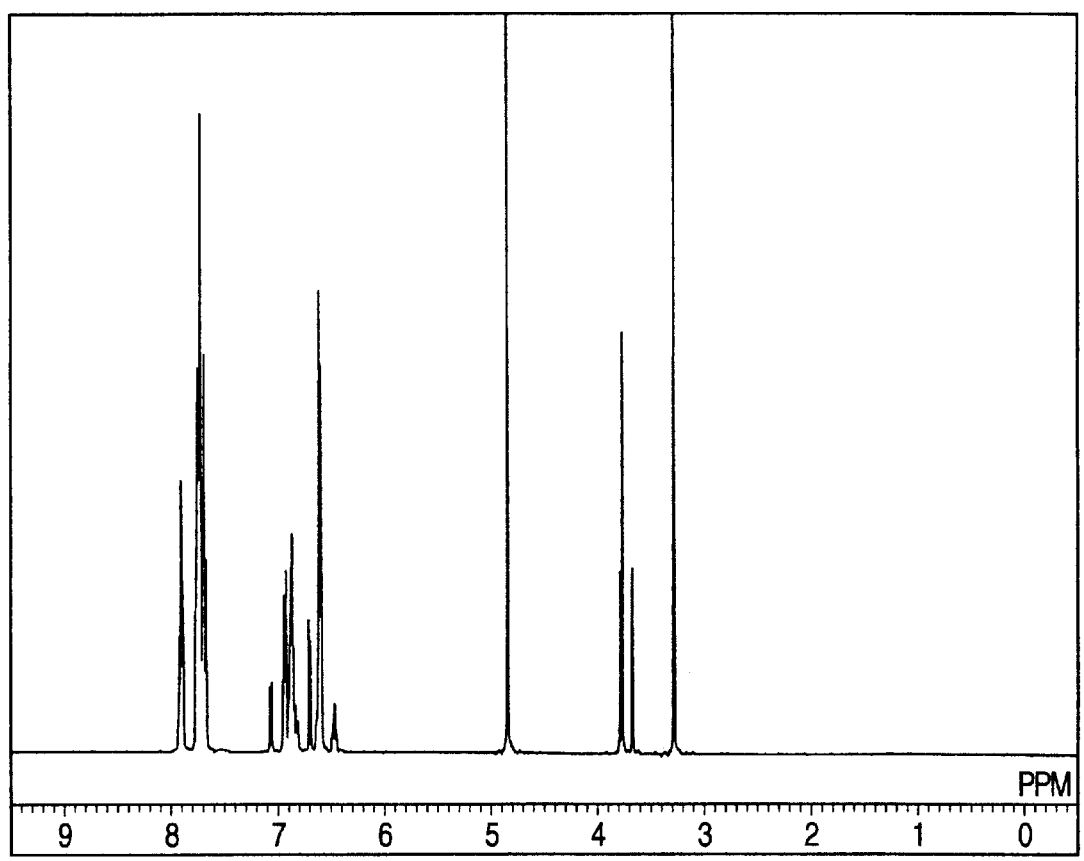
FIG. 2 is a $^1$H-NMR chart of compound C2 obtained in Synthesis Example 2.

Into a 5-liter separable flask were charged 300 g (1.5 moles) of Bisphenol F-D (corresponding to the compound (Y)) manufactured by HONSHU Chemical Industry Co., Ltd., 314 g (0.75 mole) of tetraphenylphosphonium bromide manufactured by Hokko Chemical Industry Co., Ltd., and 3,000 g of methanol, and complete dissolution was effected. A methanol/water mixed solution containing 30 g of sodium hydroxide was added dropwise thereto with stirring. The resulting solution was added dropwise to a large volume of water to carry out reprecipitation, whereby a desired product was obtained as a solid. The solid was separated by filtration and dried. The product thus obtained was named compound C2. C2 was subjected to neutralization titration to determine its alkali equivalent weight. FIG. 2 shows $^1$H-NMR data of C2. Deuterated methanol was used as a solvent for the $^1$H-NMR measurement. The peaks near 4.8 ppm and 3.3 ppm are due to the solvent. A group of peaks near 6.4–7.1 ppm are due to phenyl protons of the starting bisphenol F [number of moles per mole of (X): (a)] and a phenoxide type conjugate base [number of moles per mole of (X): (b)] obtained by removing a hydrogen atom from the bisphenol F, and a group of peaks near 7.6–8.0 ppm are due to phenyl protons of a tetraphenylphosphonium group. From the ratio between the total peak area values obtained for the two groups of peaks, the molar ratio (a+b)/(X) was calculated to be 2/1.

SYNTHESIS EXAMPLE 3

Into a 1-liter separable flask were charged 120 g (0.6 mole) of Bisphenol F-D (corresponding to the compound (Y)) manufactured by HONSHU Chemical Industry Co., Ltd., 126 g (0.3 mole) of tetraphenylphosphonium bromide manufactured by Hokko Chemical Industry Co., Ltd., and 246 g of methanol, and complete dissolution was effected with heating. A methanol/water mixed solution containing 12 g of sodium hydroxide was added dropwise thereto with stirring at an internal temperature of 65° C. Water was added dropwise to the resulting solution and after completion of the dropwise addition, the solution thus obtained was cooled to obtain a desired product as a solid. The solid was separated by filtration, washed with water, and then dried. The product thus obtained was named compound C3. C3 was subjected to neutralization titration to determine its alkali equivalent weight. $^1$H-NMR measurement was carried out by using deuterated methanol as a solvent for the measurement. From the data obtained, the molar ratio (a+b)/(X) was calculated to be 2/1, which was identical with the data obtained for compound C2 in Synthesis Example 2. Thus, it was confirmed that compound C3 was the same as compound C2.

SYNTHESIS EXAMPLES 4 to 7

In accordance with Table 1, compounds C4 to C7 were obtained in the same manner as in Synthesis Examples 1 to 3.

COMPARATIVE SYNTHESIS EXAMPLE 1

A solution of 72.05 g (0.5 mole) of sodium benzoate in 200 g of methanol was stirred at room temperature, and a solution of 209.6 g (0.5 mole) of tetraphenylphosphonium bromide in 200 g of methanol was added dropwise to the stirred solution. After completion of the dropwise addition, the resulting solution was heated to redissolve the precipitate, and then 150 g of pure water was added thereto to obtain a re-precipitated material. The re-precipitated material was filtered by suction, washed several times with pure water, and then dried for 2 hours by means of a vacuum dryer at 80° C. to obtain compound D.

TABLE 1

|  | Synthesis Example |  |  |  |  |  |  | Comparative Synthesis Example 1 |
|---|---|---|---|---|---|---|---|---|
|  | 1 | 2 | 3 | 4 | 5 | 6 | 7 |  |
| Symbol of compound | C1 | C2 | C3 | C4 | C5 | C6 | C7 | D |
| Synthetic process |  |  |  | According to Synthesis Example 2 | According to Synthesis Example 1 | According to Synthesis Example 3 | According to Synthesis Example 1 |  |
| Tetra-substituted phosphonium (X) | Tetra-phenyl-phosphonium | Tetra-phenyl-phosphonium | Tetra-phenyl-phosphonium | Tetra-phenyl-phosphonium | Methyl-triphenyl-phosphonium | (4-Hydroxy-phenoxy)-triphenyl-phosphonium | Tetra-n-butyl phosphonium | Tetra-phenyl-phosphonium |
| Compound (Y) | Bisphenol F-D*) | Bisphenol F-D*) | Bisphenol F-D*) | 1,4-benzenediol | 4,4'-iso-propylidene-diphenol**) | 1,4-benzenediol | Compound of the formula (5) | Benzoic acid |
| Alkali equivalent ($\times 10^{-3}$ N/g) | 1.28 | 1.35 | 1.34 | 1.79 | 1.25 | 1.69 | 1.11 | — |
| Molar ratio (a + b)/(X) | 2.21 | 2/1 | 2/1 | 2/1 | 2.3/1 | 2/1 | 2.2/1 | 1/1 |
| Remark |  |  | The same substance as compound C2 |  |  |  |  |  |

*)Bisphenol F-D is the trade name of a mixture of isomers of bis(monohydroxyphenyl)methane manufactured by HONSHU Chemical Industry Co., Ltd.
**)common name: bisphenol A

PREPARATION OF EPOXY RESIN COMPOSITION SAMPLES

EXAMPLES 1 to 6 AND COMPARATIVE EXAMPLES 1 and 2

Composition samples were prepared by the process described above, according to the recipe shown in Table 2. In place of the molecular association product C2 used in Example 1, triphenylphosphine was used in Comparative Example 1, and the compound D synthesized above in Comparative Synthesis Example 1 was used in Comparative Example 2. The results of evaluating the compositions prepared are shown in Table 2.

TABLE 2

|  | Example |  |  |  |  |  | Comparative Example |  |
|---|---|---|---|---|---|---|---|---|
|  | 1 | 2 | 3 | 4 | 5 | 6 | 1 | 2 |
| Recipe |  |  |  |  |  |  |  |  |
| Component A |  |  |  |  |  |  |  |  |
| EOCN-1020-65 (parts)[1)] |  |  | 67 |  |  | 67 |  | 67 |
| YX-4000H (parts)[2)] | 52 | 52 |  | 52 | 52 |  | 52 |  |
| Component (B) |  |  |  |  |  |  |  |  |
| Phenolic novolak resin (parts)[3)] |  |  | 33 |  |  | 33 |  | 33 |
| XL-225-LL (parts)[4)] | 48 | 48 |  | 48 | 48 |  | 48 |  |

TABLE 2-continued

|  | Example | | | | | | Comparative Example | |
| --- | --- | --- | --- | --- | --- | --- | --- | --- |
|  | 1 | 2 | 3 | 4 | 5 | 6 | 1 | 2 |
| Component (C) | | | | | | | | |
| Symbol of compound[5] | C2 | C1 | C4 | C5 | C6 | C7 | Triphenyl-phosphine | D |
| Adding amount (parts) | 3.3 | 3.1 | 2.3 | 3.4 | 2.5 | 3.8 | 1.1 | 3.2 |
| Characteristics | | | | | | | | |
| Torque at curing (kgf · cm) | 0.94 | 1.00 | 0.63 | 0.96 | 0.78 | 0.60 | 0.18 | 0.50 |
| Residual rate of heat generated by curing (%) | 92 | 97 | 98 | 95 | 90 | 97 | 61 | 64 |

[1] an o-cresol novolak type epoxy resin manufactured by Nippon Kayaku Co., Ltd.
[2] a biphenyl type epoxy resin manufactured by Yuka Shell Epoxy Co.
[3] hydroxyl equivalent 104, softening point 95° C.
[4] a phenol-aralkyl resin manufactured by Mitsui Chemicals, Inc.
[5] the compounds synthesized in Synthesis Examples 1, 2 and 4 to 7 and Comparative Synthesis Example 1, except triphenylphosphin.

As is clear from the evaluation results in Examples shown in Table 2, the compositions of the present invention have excellent curability and shelf life, while the composition of Comparative Example 1 obtained by using triphenylphosphine, a conventional curing accelerator is obviously inferior in curability and shelf life.

In Comparative Example 2, the salt obtained from tetraphenylphosphonium (x) and a monofunctional organic acid (OA) (molar ratio: OA=1:1) was used. The composition of Comparative Example 2 has a somewhat high curability but it is very poor in shelf life as in the case of using triphenylphosphine. Also from these results, it can be seen that the molecular association product (C) according to the present invention is much superior to the conventional curing accelerators in ability to impart curability and shelf life.

PREPARATION OF EPOXY RESIN COMPOSITIONS

EXAMPLE 7

51 Parts by weight of a resin (epoxy equivalent 185, melting point 105° C.) composed mainly of a biphenyl type epoxy resin of the formula (7), 49 parts by weight of a phenol-aralkyl resin of the formula (8) (hydroxyl equivalent 167, softening point 73° C.), 3.1 parts by weight of compound C2, 500 parts by weight of molten spherical silica (average particle size 15 μm), 2 parts by weight of carbon black, 2 parts by weight of a brominated bisphenol A type epoxy resin and 2 parts by weight of carnauba wax were mixed, kneaded at 95° C. for 8 minutes by the use of a heated roll, cooled, and then ground to obtain an epoxy resin composition. Table 3 shows the results of measuring the spiral flow, Shore D hardness and 30° C. shelf life of the epoxy resin composition obtained.

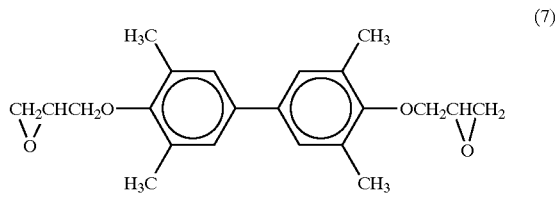

(7)

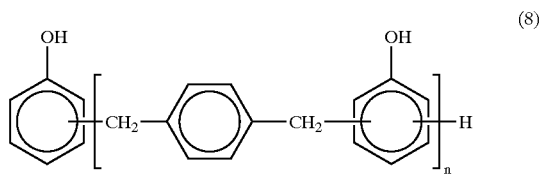

(8)

EXAMPLES 8 to 14 AND COMPARATIVE EXAMPLES 3 AND 4

Epoxy resin compositions were obtained in the same manner as in Example 7 according to the recipe shown in Table 3, and were evaluated in the same manner as in Example 7. FIG. 3 shows the results obtained.

The crystalline epoxy resin A used in Example 8 is a mixture (epoxy equivalent 209, melting point 120° C.) consisting of 60 wt % of a resin composed mainly of 4,4'-bis(2,3-epoxypropoxy)-3,3', 5,5'-tetramethylstilbene and 40 wt % of a resin composed mainly of 4,4'-bis(2,3-epoxypropoxy)-5- tert-butyl-2,3', 5'-trimethylstilbene.

The o-cresol novolak type epoxy resin used in Example 9 is EOCN-1020-65 (mfd. by Nippon Kayaku Co., Ltd.) having an epoxy equivalent of 200 and a softening point of 65° C.

The phenolic novolak resin used in Example 9 has a hydroxyl equivalent of 104 and a softening point of 105° C.

TABLE 3

|  | Example | | | | | | | | Comparative Example | |
| --- | --- | --- | --- | --- | --- | --- | --- | --- | --- | --- |
|  | 7 | 8 | 9 | 10 | 11 | 12 | 13 | 14 | 3 | 4 |
| Epoxy resin of the formula (7) | 51 |  |  | 51 | 51 | 51 | 51 | 51 | 51 | 51 |
| Crystalline epoxy resin A |  | 56 |  |  |  |  |  |  |  |  |
| o-Cresol-novolak type epoxy resin |  |  | 67 |  |  |  |  |  |  |  |
| Phenolic resin of the formula (8) | 49 | 44 |  | 49 | 49 | 49 | 49 | 49 | 49 | 49 |
| Phenolic novolak resin |  |  | 33 |  |  |  |  |  |  |  |
| C1 |  |  |  | 3.3 |  |  |  |  |  |  |
| C2 | 3.1 | 3.1 | 2.2 |  |  |  |  |  |  |  |
| C4 |  |  |  |  | 2.3 |  |  |  |  |  |
| C5 |  |  |  |  |  | 3.4 |  |  |  |  |
| C6 |  |  |  |  |  |  | 2.5 |  |  |  |
| C7 |  |  |  |  |  |  |  | 3.8 |  |  |
| Triphenylphosphine |  |  |  |  |  |  |  |  | 1.3 |  |
| D |  |  |  |  |  |  |  |  |  | 4.0 |
| Molten spherical silica | 500 | 500 | 400 | 500 | 500 | 500 | 500 | 500 | 500 | 500 |
| Carbon black | 2 | 2 | 2 | 2 | 2 | 2 | 2 | 2 | 2 | 2 |
| Brominated bisphenol A type epoxy resin | 2 | 2 | 2 | 2 | 2 | 2 | 2 | 2 | 2 | 2 |
| Carnauba wax | 2 | 2 | 2 | 2 | 2 | 2 | 2 | 2 | 2 | 2 |
| Spiral flow (cm) | 97 | 95 | 71 | 88 | 91 | 90 | 90 | 97 | 69 | 68 |
| Shore D hardness | 84 | 82 | 83 | 80 | 81 | 80 | 81 | 82 | 84 | 63 |
| 30° C. shelf life (%) | 97 | 93 | 97 | 92 | 94 | 95 | 96 | 93 | 56 | 65 |

As is clear from the evaluation results in Examples shown in Table 3, the epoxy resin compositions of the present inventions have excellent fluidity, curability and shelf life, while the composition of Comparative Example 3 obtained by using triphenylphosphine, a conventional curing accelerator is obviously inferior in curability and shelf life.

In Comparative Example 4, the salt obtained from tetraphenylphosphonium (x) and a monofunctional organic acid (OA) (molar ratiox: OA=1:1) was used. The composition of Comparative Example 4 is very poor in shelf life and fluidity as in the case of using triphenylphosphine. Also from these results, it can be seen that the epoxy resin composition obtained by the use of the molecular association product (C) according to the present invention is much superior in fluidity, curability and shelf life to compositions obtained by the use of the conventional curing accelerators.

INDUSTRIAL APPLICABILITY

The epoxy resin composition of the present invention is excellent in curability and shelf life. Said composition can contribute to the improvement of production efficiency and the improvement of handleability at the time of transportation and storage when used as an encapsulating material for electric and electronic parts. Thus, said composition can satisfy requirements in the field of electric and electronic materials and hence is useful.

What is claimed is:

1. An epoxy resin composition comprising:
   (A) a compound having two or more epoxy groups in the molecule,
   (B) a co-condensation product having two or more phenolic hydroxyl groups in the molecule, and
   (C) a molecular association product which consists of
      (C-i) a tetra-substituted phosphonium (X),
      (C-ii) a compound (Y) having two or more phenolic hydroxyl groups in the molecule, and
      (C-iii) a conjugate base of the compound (Y) having two or more phenolic hydroxyl groups in the molecule, said conjugate base being a phenoxide compound obtained by removing a hydrogen atom from the aforesaid compound (Y) having two or more phenolic hydroxyl groups in the molecule.

2. An epoxy resin composition according to claim 1, wherein the compound (Y) having two or more phenolic hydroxyl groups in the molecule is at least one kind selected from the group consisting of dihydroxybenzenes, trihydroxybenzenes, bisphenols, biphenols, dihydroxynaphthalenes, phenolic novolak resins, and phenol-aralkyl resins.

3. An epoxy resin composition according to claim 1, wherein the molecular association product (C) is one which is obtained by reacting a tetra-substituted phosphonium tetra-substituted borate (Z) with a compound (Y) having two or more phenolic hydroxyl groups in the molecule, at a high temperature, and then subjecting the reaction product to thermal reaction in a solvent having a boiling point of 60° C. or higher.

4. An epoxy resin composition according to claim 1, wherein the molecular association product (C) is one which is obtained by reacting a compound (Y) having two or more phenolic hydroxyl groups in the molecule, with an inorganic or organic base and a tetra-substituted phosphonium halide.

5. An epoxy resin composition according to claim 1, wherein the tetra-substituted phosphonium (X) is tetraphenylphosphonium.

6. An epoxy resin composition according to claim 1, wherein the compound (A) having two or more epoxy groups in the molecule is a crystalline epoxy resin having a melting point of 50–150° C.

7. An epoxy resin composition according to claim 6, wherein the crystalline epoxy resin having a melting point of 50–150° C. is at least one epoxy resin selected from epoxy resins represented by the general formula (1) and the general formula (2):

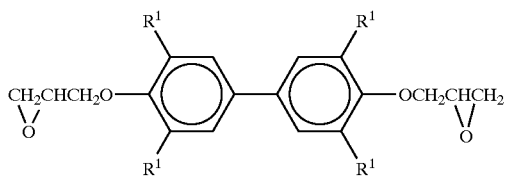

wherein $R^1$'s, which may be the same or different, are a group or atom selected from the group consisting of hydrogen atom, chain or cyclic alkyl groups of at most 6 carbon atoms, phenyl group and halogen atoms, and

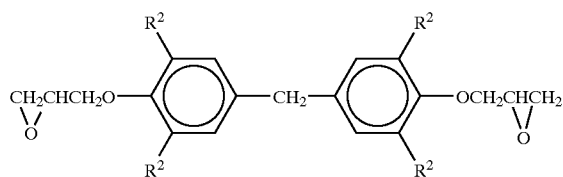

wherein $R^2$'s, which may be the same or different, are a group or atom selected from the group consisting of hydrogen atom, chain or cyclic alkyl groups of at most 6 carbon atoms, phenyl group and halogen atoms.

8. An epoxy resin composition according to claim 1, wherein the co-condensation product (B) having two or more phenolic hydroxyl groups in the molecule is a phenol-aralkyl resin.

9. An epoxy resin composition according to claim 2, wherein the molecular association product (C) is one which is obtained by reacting a tetra-substituted phosphonium tetra-substituted borate (Z) with a compound (Y) having two or more phenolic hydroxyl groups in the molecule, at a high temperature, and then subjecting the reaction products to thermal reaction in a solvent having a boiling point of 60° C. or higher.

10. An epoxy resin composition according to claim 2, wherein the molecular association product (C) is one which is obtained by reacting a compound (Y) having two or more phenolic hydroxyl groups in the molecule, with an inorganic or organic base and a tetra-substituted phosphonium halide.

11. An epoxy resin composition according to claim 2, wherein the tetra-substituted phosphonium (X) is tetraphenylphosphonium.

12. An epoxy resin composition according to claim 3, wherein the tetra-substituted phosphonium (X) is tetraphenylphosphonium.

13. An epoxy resin composition according to claim 4, wherein the tetra-substituted phosphonium (X) is tetraphenylphosphonium.

14. An epoxy resin composition according to claim 2, wherein the compound (A) having two or more epoxy groups in the molecule is a crystalline epoxy resin having a melting point of 50–150° C.

15. An epoxy resin composition according to claim 3, wherein the compound (A) having two or more epoxy groups in the molecule is a crystalline epoxy resin having a melting point of 50–150° C.

16. An epoxy resin composition according to claim 4, wherein the compound (A) having two or more epoxy groups in the molecule is a crystalline epoxy resin having a melting point of 50–150° C.

17. An epoxy resin composition according to claim 5, wherein the compound (A) having two or more epoxy groups in the molecule is a crystalline epoxy resin having a melting point of 50–150° C.

18. An epoxy resin composition according to claim 2, wherein the co-condensation product (B) having two or more phenolic hydroxyl groups in the molecule is a phenol-aralkyl resin.

19. An epoxy resin composition according to claim 3, wherein the co-condensation product (B) having two or more phenolic hydroxyl groups in the molecule is a phenol-aralkyl resin.

20. An epoxy resin composition according to claim 4, wherein the co-condensation product (B) having two or more phenolic hydroxyl groups in the molecule is a phenol-aralkyl resin.

21. An epoxy resin composition according to claim 5, wherein the co-condensation product (B) having two or more phenolic hydroxyl groups in the molecule is a phenol-aralkyl resin.

22. An epoxy resin composition according to claim 6, wherein the co-condensation product (B) having two or more phenolic hydroxyl groups in the molecule is a phenol-aralkyl resin.

23. An epoxy resin composition according to claim 9, wherein the co-condensation product (B) having two or more phenolic hydroxyl groups in the molecule is a phenol-aralkyl resin.

24. An epoxy resin composition according to claim 10, wherein the co-condensation product (B) having two or more phenolic hydroxyl groups in the molecule is a phenol-aralkyl resin.

25. An epoxy resin composition according to claim 11, wherein the co-condensation product (B) having two or more phenolic hydroxyl groups in the molecule is a phenol-aralkyl resin.

26. An epoxy resin composition according to claim 12, wherein the co-condensation product (B) having two or more phenolic hydroxyl groups in the molecule is a phenol-aralkyl resin.

27. An epoxy resin composition according to claim 13, wherein the co-condensation product (B) having two or more phenolic hydroxyl groups in the molecule is a phenol-aralkyl resin.

28. An epoxy resin composition according to claim 14, wherein the co-condensation product (B) having two or more phenolic hydroxyl groups in the molecule is a phenol-aralkyl resin.

* * * * *